United States Patent [19]

Aoki et al.

[11] 4,081,292
[45] Mar. 28, 1978

[54] METHOD OF MANUFACTURING A SEMI-INSULATING SILICON LAYER

[75] Inventors: Teruaki Aoki, Tokyo; Takeshi Matsushita, Sagamihara; Tadayoshi Mifune, Yokohama; Motoaki Abe, Hiratsuka, all of Japan

[73] Assignee: Sony Corporation, Tokyo, Japan

[21] Appl. No.: 678,417

[22] Filed: Apr. 19, 1976

[30] Foreign Application Priority Data

Apr. 21, 1975 Japan ................................. 50-48379

[51] Int. Cl.² .......................................... H01L 21/26
[52] U.S. Cl. ..................................... 148/1.5; 148/187; 357/52; 357/59; 357/91; 427/93; 427/94

[58] Field of Search ..................... 148/1.5; 357/52, 59, 357/91; 427/93, 94

[56] References Cited

U.S. PATENT DOCUMENTS

| 3,897,274 | 7/1975 | Stehlin et al. | 148/1.5 |
| 3,900,345 | 8/1975 | Lesk | 148/175 X |
| 4,014,037 | 3/1977 | Matsushita et al. | 357/52 |

*Primary Examiner*—G. Ozaki
*Attorney, Agent, or Firm*—Hill, Gross, Simpson, Van Santen, Steadman, Chiara & Simpson

[57] ABSTRACT

Silicon ions are implanted in a silicon dioxide layer on a silicon substrate so that the dioxide layer is converted into a semi-insulating layer having an improved passivation property.

13 Claims, 6 Drawing Figures

METHOD OF MANUFACTURING A SEMI-INSULATING SILICON LAYER

BACKGROUND OF THE INVENTION

This invention relates to a semiconductor device and to a method of manufacturing a semi-insulating layer therefor, and in particular, relates to semiconductor devices such as diodes, transistors, or resistors which have one or more surface passivating layers, and to a method of manufacturing the same.

Conventional passivating layers include a $SiO_2$ layer, a glass layer with phosphorus and a $Si_3N_4$ layer. In the case of $SiO_2$ layer, electric charges are induced at a surface of a semiconductor substrate by electric charges in the $SiO_2$ layer, which are fixed by the polarization in a molding resin, and it deteriorates the breakdown voltage and the reliability influenced by an external electric field. The above passivating layers have a bad water-resisting property, where the leakage current varies according to humidity conditions.

A pure polycrystalline silicon layer was also proposed for passivation, but it has a large leakage current and a small DC current gain, $h_{FE}$, while it has a high breakdown voltage.

Matsushita el al applications, Ser. Nos. 561,532 (now Pat. No. 4,014,037) and 624,889, filed on Mar. 24, 1975 and Oct. 22, 1975, respectively, and assigned to the same assignee as the present invention, disclose a polycrystalline silicon layer with oxygen atoms and/or nitrogen atoms for passivation, where the resistance of the polycrystalline silicon layer is semi-insulating in characteristic, having a resistivity of approximately $10^7$ to $10^{11}$ atoms/cm, and the breakdown voltage and the reliability from resistance to water and improved. This layer was provided not only for passivation, but also for the formation of a resistor or the like.

This polycrystalline silicon layer is uniformly formed by a chemical vapor deposition, in which silicon is deposited by a thermal decomposition of $SiH_4$ and oxygen or nitrogen is doped in silicon by a decomposition of nitrogen oxide ($N_2O$, etc.) or $NH_3$, respectively. This method is suitable for a uniform passivating layer, but it is difficult to control the gas flow rate and temperature to determine the oxygen or nitrogen concentration, to form a layer selectively or to vary the concentration profile laterally.

SUMMARY OF THE INVENTION

This invention provides a novel semiconductor device and a novel method of manufacturing a silicon compound layer. Silicon ions are implanted into the silicon compound layer to convert it into a semi-insulating layer.

This improves a passivation property of the silicon compound layer and enables the exact control of the oxygen or nitrogen concentration and distribution.

The silicon compound layer is converted into a polycrystalline silicon or amorphous silicon layer, which has a grain size of silicon less than 1000 A (e.g., 100 to 200 A). The dosing of $Si^+$ ions implanted into, e.g., an $SiO_2$ layer, is selected so that the bottom of the semi-insulating layer has 2 to 45 atomic percent oxygen, preferably 15 to 35 atomic percent, in order to have a good passivation. It has been observed that there is an objectionable leakage current if oxygen is much less, and undesirable results occur such as those of $SiO_2$ if oxygen is much more. The dosing of $Si^+$ ions implanted into a $Si_3N_4$ layer is selected so that the bottom of the semi-insulating layer has more than 10 atomic percent nitrogen. The resistivity and water-protecting property are deteriorated if nitrogen is much less.

DESCRIPTION OF THE PREFERRED EMBODIMENTS

Figure 1A:
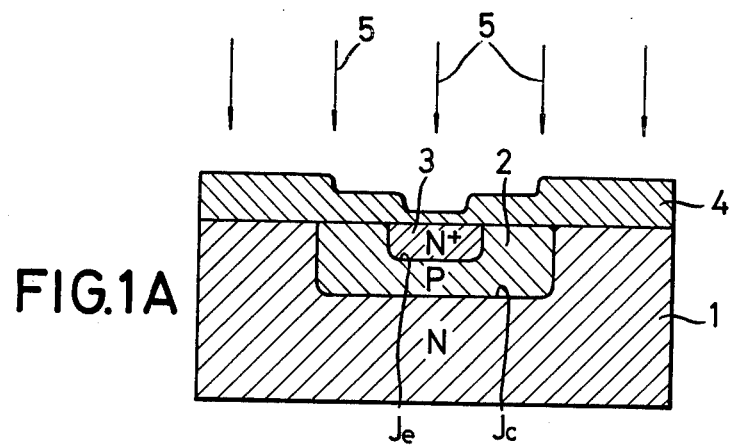
FIGS. 1A and 1C show a first embodiment of this invention applied to a bipolar transistor.
Figure 1B:
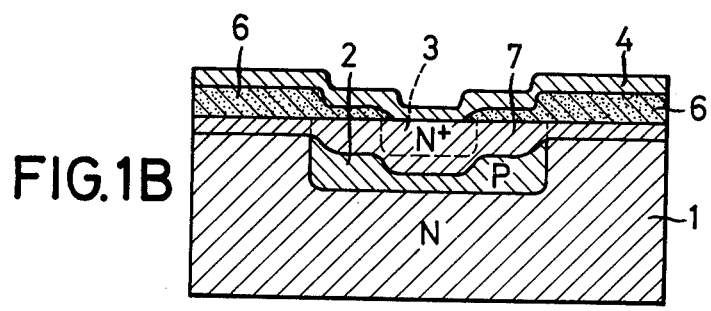
Figure 1C:
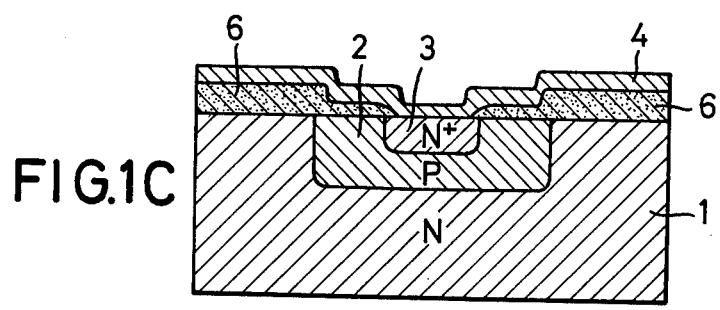

FIGS. 1A to 1C show a first embodiment of this invention applied to a bipolar transistor.

A P type base region 2 and an N+ type emitter region 3 are diffused into an N type silicon substrate 1. A $SiO_2$ layer is used as a mask for emitter and base diffusions, and has various thicknesses. It is 0.22$\mu$ thick over the collector-base junction $J_c$ and is thinner over the emitter-base junction $J_E$ and is the thinnest over the emitter.

The $Si^+$ ion beam 5 implants ions into the substrate 1 with an accelerating energy of 200 KeV. The mean projected range $R_p$ of ions is 0.22$\mu$. (FIG. 1A).

Figure 2:
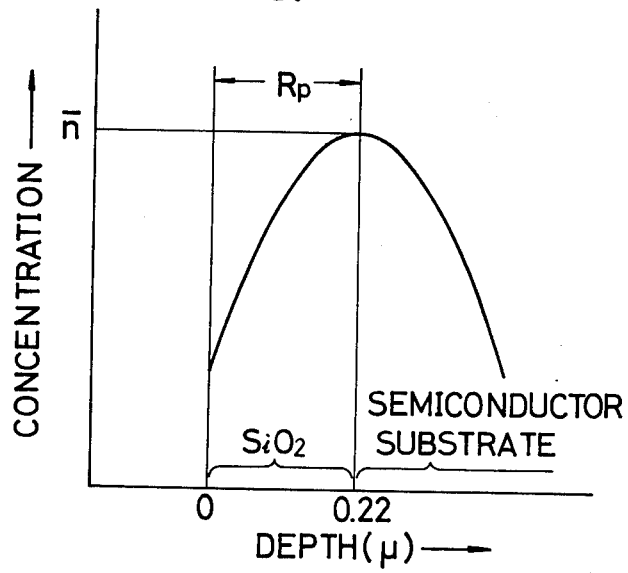
FIG. 2 shows the concentration of the implanted silicon ions.

FIG. 2 shows the silicon ion concentration in the $SiO_2$ layer 4 and the substrate 1. A lower portion of the $SiO_2$ layer 4 has many silicon ions and is converted into a polycrystalline silicon layer 6 with oxygen. Its resistivity is lower than that of $SiO_2$ (FIG. 1B). In the $SiO_2$ layer, where the thickness is almost equal to $R_p$, the silicon concentration is maximum, and the oxygen concentration is minimum at the interface between the substrate 1 and the semiinsulating layer 6. The oxygen concentration is higher in the upper portion of the layer 6. In the $SiO_2$ layer, where the thickness is less than $R_p$, the semi-insulating layer 6 exists in the lower portion. The semi-insulating layer covers $J_e$ and $J_c$, where the oxygen concentration is low on $J_c$ and high on $J_e$.

$Si^+$ ions are also implanted into the substrate 1 through the $SiO_2$ layer 4 and the surface portion of the substrate 1 is converted into an amorphous silicon layer 7.

Annealing above 500° C, the amorphous layer 7 is restored to a single crystal (FIG. 1C).

The $SiO_2$ layer 4 is selectively etched by HF, and the polycrystalline silicon layer 7 is selectively etched by $HNO_3$: HF: HCOOH = 5:1:4 by volume to contact emitter and base electrodes.

We will point out what occurs when the $Si^+$ ion dosing with the assumed oxygen concentration of 20 atomic percent at the interface between the semi-insulating layer 6 and the substrate 1. The $SiO_2$ layer has 0.22$\mu$ thickness and the energy is 200 KeV. When there are $x$ silicon atoms added in $SiO_2$, $$\frac{2}{(1 + x) + 2} = 0.2$$

$x = 7$ is obtained, which means seven silicon atoms must be injected in 1 mol $SiO_2$. Accordingly, $1.6 \times 10^{23}$ atoms/cm$_3$ of silicon are injected. Actual $Si^+$ ion dosing is $1.6 \times 10^{18}$ cm$^{-2}$.

The semi-insulating layer of this invention has a good passivation property because it has a smaller resistivity than that of $SiO_2$ and shields external electric fields. It has a smaller leakage current than that of pure polycrystalline silicon. The SiO₂ layer 4 on the semi-insulating layer 6 serves for water-protecting and electrical insulation.

Figure 3A:
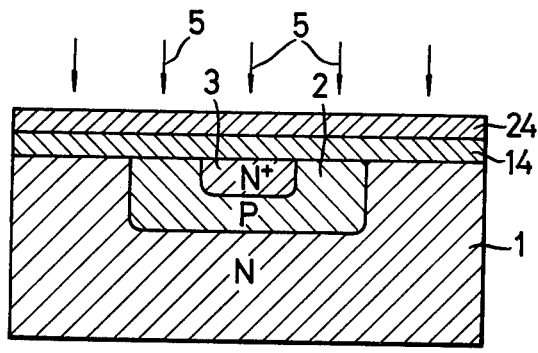
FIGS. 3A and 3B show a second embodiment of this invention applied to a bipolar transistor.
Figure 3B:
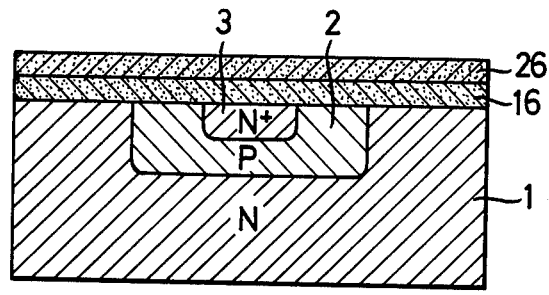

FIGS. 3A to 3B show a second embodiment of this invention.

A SiO₂ layer 14 of 0.12μ thickness and a Si₃N₄ layer 24 of 0.1μ thickness are deposited on a silicon substrate 1. A Si⁺ ion beam 5 is implanted having an energy of a little less than 200 KeV and the dosing of $1.6 \times 10^{18}$ cm⁻². $R_p$ is smaller than the total thickness of the SiO₂ layer 14 and the Si₃N₄ layer 24 (FIG. 3A).

After annealing, the SiO₂ layer 14 and the Si₃N₄ layer 24 are converted into semi-insulating layers 16 and 26, and an amorphous silicon layer in the substrate 1 (not shown) is restored to a single crystal. (FIG. 3B). The semi-insulating layer 16 contains 20 atomic percent oxygen at the bottom, and the oxygen concentration is larger in the upper portion. The lower portion of the semi-insulating layer 26 is a polycrystalline silicon layer containing less than 57 atomic percent nitrogen, which is equal to that in Si₃N₄. The whole of the Si₃N₄ layer 24 will be converted into a semi-insulating layer if the layer is thinner or the ion energy is lower.

As described in Ser. No. 624,889, the structure of the nitrogen doped polycrystalline silicon layer and the oxygen doped polycrystalline silicon layer provide a water-protecting property. The V-I characteristic of a diode is not changed by a steam treatment.

This invention has several modifications. The accelerating energy of ion beam, the dosing amount and the thickness of a SiO₂ or a Si₃N₄ layer can be modified. The dosing profile can be laterally varied. A polycrystalline silicon containing oxygen and nitrogen is obtained from a silicon compound of oxygen and nitrogen. This layer can be interposed between two semi-insulating layers in the second embodiment. If Si⁺ ions are selectively implanted, the layer is selectively etched by an etchant of silicon. This invention is applicable to a mesa structure device or a resistor.

It will be apparent to those skilled in the art that many modifications and variations may be effected without departing from the spirit and scope of the novel concepts of the present invention.

We claim as our invention:

1. The method of manufacturing an element which includes forming a silicon compound layer on a silicon substrate, the silicon compound layer initially being an insulator, implanting silicon ions by a silicon ion beam into said compound layer and into a portion of said substrate on the side of its interface with said compound layer, said compound layer being converted thereby into a semi-insulating layer, said portion of said substrate being converted into an amorphous silicon portion, annealing said substrate, whereby said portion is reconverted to form a single crystal with the remaining portion of said substrate.

2. A method according to claim 1, in which said compound layer is SiO₂.

3. A method according to claim 2, in which a silicon ion beam implants silicon ions into said silicon dioxide layer, the energy of said silicon ion beam being selected sufficient to convert the silicon dioxide layer into a polycrystalline silicon layer having a concentration of 2 to 45 atomic percent of oxygen at the bottom of the insulating layer.

4. A method according to claim 2, in which a silicon ion beam implants silicon ions into said silicon dioxide layer, the energy of said silicon ion beam being selected sufficient to convert the silicon dioxide layer into a polycrystalline silicon layer having a concentration of 15 to 35 atomic percent of oxygen at the bottom of the insulating layer.

5. A method according to claim 1, in which said compound layer is Si₃N₄.

6. A method according to claim 3, in which a silicon ion beam implants silicon ions into said silicon nitride layer, the energy of said silicon ion beam being selected sufficient to convert the silicon nitride layer into a polycrystalline silicon layer having a concentration above 10 atomic percent of nitrogen at the bottom of the insulating layer.

7. A method of manufacturing a semiconductor device which includes forming a silicon compound layer on a semiconductor substrate, subjecting said layer to a silicon ion beam to implant silicon ions in said layer, and then converting said layer into a semi-insulating layer.

8. The method of manufacturing a bipolar junction transistor device which includes forming a silicon dioxide mask on one planar face of a single crystal semiconductor substrate of a first conductivity type to provide a collector region by selectively etching said mask, causing a base region of the opposite conductivity type to be diffused into said one planar surface to provide a base region, causing an emitter region of said first conductivity type to be diffused into the planar face of said base region, reducing the thickness of said SiO₂ layer over a portion of said base region and over the surface region of the emitter-base junction, reducing the SiO₂ layer over said emitter region which lies radially inwardly of said emitter-base junction, subjecting the side of said device which contains said base and said emitter to a silicon ion beam having a mean depth of ion penetration which approximately equals the original thickness of said SiO₂ layer, whereby the lower portion of said SiO₂ layer is converted into a polycrystalline silicon layer and the upper portion of said substrate is converted into an amorphous layer, annealing said substrate, whereby said amorphous layer is converted back into a single crystal portion of said substrate.

9. The method of manufacturing a bipolar junction transistor device according to claim 8, in which the temperature of the annealing step is at a temperature of over 500° C.

10. The method of manufacturing a bipolar junction transistor device according to claim 8, in which the accelerating energy of the silicon ion beam is approximately 200 KeV.

11. The method of manufacturing a bipolar junction transistor device according to claim 8, wherein the accelerating energy of the silicon ion beam is sufficient to convert the region of said SiO₂ layer above said collector region and above said base region into a polycrystalline region.

12. The method of manufacturing a bipolar junction transistor device according to claim 8, wherein an additional Si₃N₄ layer is deposited on said SiO₂ layer before said substrate is subjected to a silicon ion beam, the combined thickness of said original SiO₂ layer and said Si₃N₄ layer being approximately 0.22μ and wherein the dosing by said Si⁺ ion beam is $1.6 \times 10^{18}$ cm⁻², whereby after said annealing step the Si₃N₄ and the SiO₂ layers are converted into polycrystalline layers.

13. A method of manufacturing a bipolar junction transistor having a substrate, a collector region formed in a planar surface of said substrate, a base region formed in the planar surface of said collector region and an emitter formed in the planar surface of said base region, forming a silicon dioxide layer on the surface of said substrate which at least covers the ends of the base-collector junction and the emitter-base junction, subjecting the silicon dioxide layer to a silicon ion beam to implant silicon ions in the silicon dioxide layer, the energy of the silicon ion beam being such as to cause the mean depth of penetration of silicon ions to be approximately equal to the depth of said silicon dioxide layer, and annealing said layer whereby said layer is converted into a semi-insulating layer.

* * * * *